(12) United States Patent
Hoogzaad et al.

(10) Patent No.: US 12,549,140 B2
(45) Date of Patent: Feb. 10, 2026

(54) CIRCUIT

(71) Applicant: NXP B.V., Eindhoven (NL)

(72) Inventors: Gian Hoogzaad, Mook (NL); Gerben Willem de Jong, Veldhoven (NL); Robert Victor Buytenhuijs, Wijchen (NL)

(73) Assignee: NXP B.V., Eindhoven (NL)

( * ) Notice: Subject to any disclaimer, the term of this patent is extended or adjusted under 35 U.S.C. 154(b) by 573 days.

(21) Appl. No.: 18/052,992

(22) Filed: Nov. 7, 2022

(65) Prior Publication Data

US 2023/0170853 A1 Jun. 1, 2023

(30) Foreign Application Priority Data

Nov. 30, 2021 (EP) .................................. 21211491

(51) Int. Cl.
*H03F 1/56* (2006.01)
*H03F 1/22* (2006.01)
*H03F 1/52* (2006.01)
*H03F 3/16* (2006.01)

(52) U.S. Cl.
CPC ............ *H03F 1/565* (2013.01); *H03F 1/226* (2013.01); *H03F 1/523* (2013.01); *H03F 3/165* (2013.01); *H03F 2200/462* (2013.01)

(58) Field of Classification Search
CPC .......... H03F 1/565; H03F 1/226; H03F 1/523; H03F 3/165; H03F 2200/462; H03F 3/245; H03F 2200/294; H03F 2200/451; H03F 1/347; H03F 3/19; H03F 3/195; H03F 1/22; H03K 19/017545; H03K 19/00346; H04B 1/16
USPC .................................. 330/250, 311, 277, 79
See application file for complete search history.

(56) References Cited

U.S. PATENT DOCUMENTS

| 9,831,832 | B2 | 11/2017 | Hu et al. |
| 12,034,411 | B2 * | 7/2024 | Fard ......................... H03F 3/24 |
| 2010/0259319 | A1 | 10/2010 | Chan et al. |
| 2011/0115572 | A1 | 5/2011 | Chan |

FOREIGN PATENT DOCUMENTS

CN 103457555 A 12/2013

OTHER PUBLICATIONS

Bagga, S., "A Frequency-Selective Broadband Low-Noise Amplifier with Double-Loop Transformer Feedback", IEEE Transactions on Circuits and Systems—I; Regular Papers, vol. 61, No. 6, Jun. 6, 2014.

Chang, P., "An Ultra-Low-Power Transformer-Feedback 60 GHz Low-Noise Amplifier in 90 nm CMOS", IEEE Microwave and Wireless Components Letters, vol. 22, No. 4, Apr. 2012.

(Continued)

*Primary Examiner* — Hieu P Nguyen

(57) ABSTRACT

A circuit comprising: an input terminal; a first amplifier coupled to the input terminal of the circuit to receive an input signal; a first inductor having a first terminal coupled to the input terminal and a second terminal configured to be coupled to the ground terminal, wherein the first inductor is arranged with a second inductor and configured to magnetically couple therewith, wherein said second inductor is coupled to the first amplifier and is configured to sense a current through the amplifier.

18 Claims, 5 Drawing Sheets

(56) References Cited

OTHER PUBLICATIONS

Chiang, P., "A 10~18GHz Wideband Transformer Feedback LNA", RFIT 2007—IEEE International Workshop on Radio-Frequency Integration Technology, Dec. 9-11, 2007.
Jeon, J., "A Transformer Feedback Wideband CMOS LNA for UWB Application", Asia-Pacific Microwave Conference, Dec. 6, 2015.
Wu, L., "Design and Analysis of CMOS LNAs with Transformer Feedback for Wideband Input Matching and Noise Cancellation", IEEE Transactions on Circuits and Systems—I: Regular Papers, vol. 64, No. 6, Jun. 2017.
EP Application No. 21171588.3, titled "Antenna Switch Circuit and Method", and filed on Apr. 30, 2021.

* cited by examiner

CIRCUIT

CROSS-REFERENCE TO RELATED APPLICATIONS

This application claims the priority under 35 U.S.C. § 119 of European Patent application no. 21211491.2, filed on 30 Nov. 2021, the contents of which are incorporated by reference herein.

FIELD

The present disclosure relates to a circuit and, in particular, a circuit having an input terminal and a switch coupled to said input terminal and including electrostatic discharge protection. The present disclosure also relates to the circuit formed on an amplifier die in combination with a switch die.

BACKGROUND

A transmitter and receiver may be configured to transmit and receive one or more signals by a common antenna. A receiver front end module, which may comprise one or more dies, is coupled to the antenna. The receiver front end module may include a switch at its input from the antenna, which may be configured to decouple the receiver front end module when it is not receiving signals.

SUMMARY

According to a first aspect of the present disclosure there is provided a circuit comprising:

an input terminal;

a first amplifier coupled to the input terminal of the circuit to receive an input signal;

a first inductor having a first terminal coupled to the input terminal and a second terminal configured to be coupled to the ground terminal, wherein the first inductor is arranged with a second inductor and configured to magnetically couple therewith, wherein said second inductor is coupled to the first amplifier and is configured to sense a current through the amplifier.

In one or more examples, the first inductor and second inductor collectively comprise a transformer.

In one or more embodiments, said first inductor, in combination with said second inductor, is configured to tune out a capacitance at the input terminal.

In one or more examples, said circuit includes one or more components coupled to the input terminal that introduce a parasitic capacitance to said circuit.

In one or more embodiments, the circuit includes a first switch having a first terminal coupled to the input terminal and a second terminal coupled to a ground terminal, the ground terminal configured to be coupled to a reference voltage.

Thus, in one or more examples, the first inductor, in combination with said second inductor, is configured to tune out a parasitic capacitance of said first switch when it is in an off-state.

In one or more embodiments, said first inductor, in combination with said second inductor, is configured to tune out a capacitance at the input terminal provided by one or more of:

an antenna;
a filter;
an input matching network;
an interconnect that couples the circuit to one or more other components;
a transmission line;
a parasitic capacitance of an inductor;
a substrate capacitance of an AC-coupling capacitor or DC-blocking capacitor.

In one or more embodiments, the first amplifier comprises a cascode arrangement of a first transistor and a second transistor, the first transistor having a first terminal, a second terminal and a control terminal, and the second transistor having a first terminal, a second terminal and a control terminal, wherein the first terminal of the first transistor is coupled to a supply voltage terminal for receiving a supply voltage, the control terminal of the second transistor is coupled to the input terminal, the first terminal of the second transistor is coupled with the second terminal of the first transistor to form said cascode arrangement, and the second terminal of the second transistor is coupled to the ground terminal.

In one or more embodiments, said second inductor is coupled in series with between the supply voltage terminal and the first transistor and comprises a first terminal coupled to the first terminal of the first transistor and a second terminal coupled to the supply voltage terminal.

In one or more embodiments, said second inductor is coupled in series between the first transistor and the second transistor and comprises a first terminal coupled to the second terminal of the first transistor and a second terminal coupled to the first terminal of the second transistor.

In one or more embodiments, said second inductor is coupled in series with between the second transistor and the ground terminal and comprises a first terminal coupled to the second terminal of the second transistor and a second terminal coupled to the ground terminal.

In one or more embodiments, said first inductor is configured to provide electrostatic discharge protection for said circuit.

In one or more embodiments, said first amplifier comprises a low noise amplifier.

In one or more embodiments, the circuit is configured such that, when in use, the impedance of the first inductor is reduced by the coupling with the second inductor which leads to the first inductor having an effective inductance value lower than its actual inductance value and wherein the effective inductance value is configured to tune out a parasitic capacitance present at the input terminal.

In one or more embodiments, the first inductor and second inductor are aligned with one another in separate layers of one of a die, a laminate or a printed circuit board.

In one or more embodiments, said circuit is formed on a die of Silicon-Germanium.

In one or more embodiments, said circuit is formed on an amplifier die and is provided in combination with a switch die, separate from the amplifier die, wherein the combination of the switch die and the amplifier die comprises an arrangement for forming a transceiver front end module, said switch die having a first switch-die terminal for coupling to an antenna; a second switch-die terminal coupled to the input terminal of the amplifier-die; and a switch-die-switch having a first terminal, which is coupled to one of the first switch-die terminal and the second switch-die terminal, and a second terminal for coupling to a transmitter terminal, the transmitter terminal for receiving a transmit signal for passing to an antenna at the first switch-die terminal.

In one or more embodiments, said switch-die is of Silicon on Insulator CMOS type.

According to a further aspect of the disclosure, we provide an electronic device including the circuit of the first aspect.

In one or more examples, a turn ratio between the first inductor and the second inductor is N:1 wherein N is between 1 and 25

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
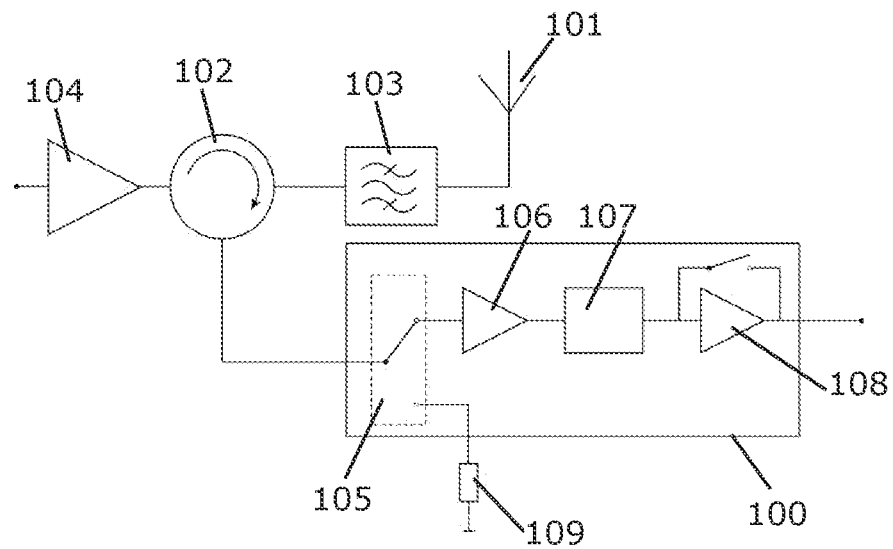
FIG. 1 shows an example front end module.

FIG. 1 shows a front end module 100 coupled to an antenna 101. In this example, the front end module 100 is coupled to the antenna 101 via a circulator 102 and a filter 103. A transmitter represented by a power amplifier 104 is also coupled to the antenna 101 via the circulator 102 and the filter 103. In general terms, the front end module 100 includes a switch 105 at its input. The switch 105 may be configured to couple a receiver path of the remainder of the front end module 100 to the antenna 101. In this example, the receiver path includes a low noise amplifier 106 and several other receiver path components. The other receiver path components may include an optional digital stepped attenuator (DSA) 107 and/or a further low noise amplifier 108. In this example, the switch 105 switches between the receiver path and a first terminal of a termination resistor 109 which is grounded at its other terminal.

Thus, in one or more examples, when transmitting, the switch may be in a first state to protect the one or more amplifiers 106 of the receiver and, optionally, direct any reflected power from the antenna away from the receiver, such as to the termination resistor 109. When receiving, the switch is configured to be in a second state to direct the one or more signals received from the antenna 101 to the one or more amplifiers 106 of the receiver and isolate termination resistor 109.

Figure 2:
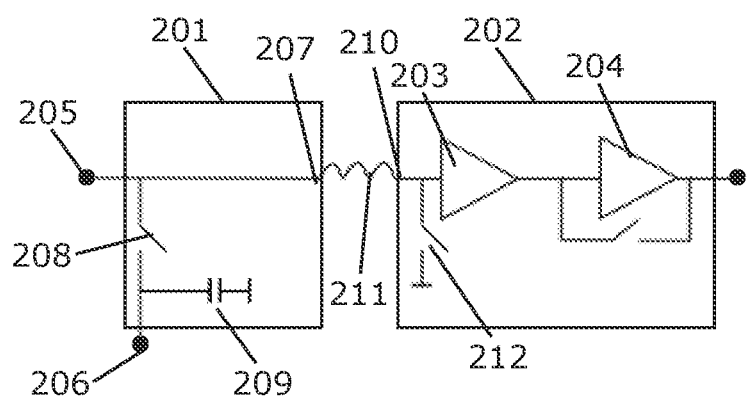
FIG. 2 shows an implementation of a switch for a front end module.

FIG. 2 shows an implementation of the switch 105 along with one or more amplifiers. In this example, there is provided a switch die 201 (or, more generally, a switch circuit) and an amplifier die 202 (or more generally a circuit) comprising at least one amplifier 203, 204. The switch die 201 has a first terminal 205 for coupling to the antenna, a second terminal 206 for coupling to a termination resistor or an output from a transmitter (to couple the transmitter to the antenna), and a third terminal 207 for coupling to the amplifier die. The first terminal 205 is coupled to the third terminal 207 and the switch die 201 comprises a first switch 208 configured to provide a switched connection between the first/third terminal 205, 207 and the second terminal 206. A capacitor 209 is coupled to the second terminal 206 at its first plate and its second plate is configured to couple to reference voltage, such as ground. The third terminal 207 is coupled to a first terminal 210 of the amplifier die 202 by an inductor 211. The inductor 211 typically comprises a bondwire between the dies 201 and 202. The amplifier die comprises a second switch 212 providing a switched connection between the first terminal 210 of the amplifier die 202 and a ground terminal. The one or more amplifiers 203, 204 are also coupled to the first terminal 210 in series. Thus, in general, the switch 105 of FIG. 1 is implemented in example FIG. 2 by a switch die 201, the first switch 208, the inductor 211 providing a coupling to the amplifier die and the second switch 212. It has been found that, in one or more examples, that the switch 212 may provide an undesirable input capacitance to the amplifier die.

Figure 3:
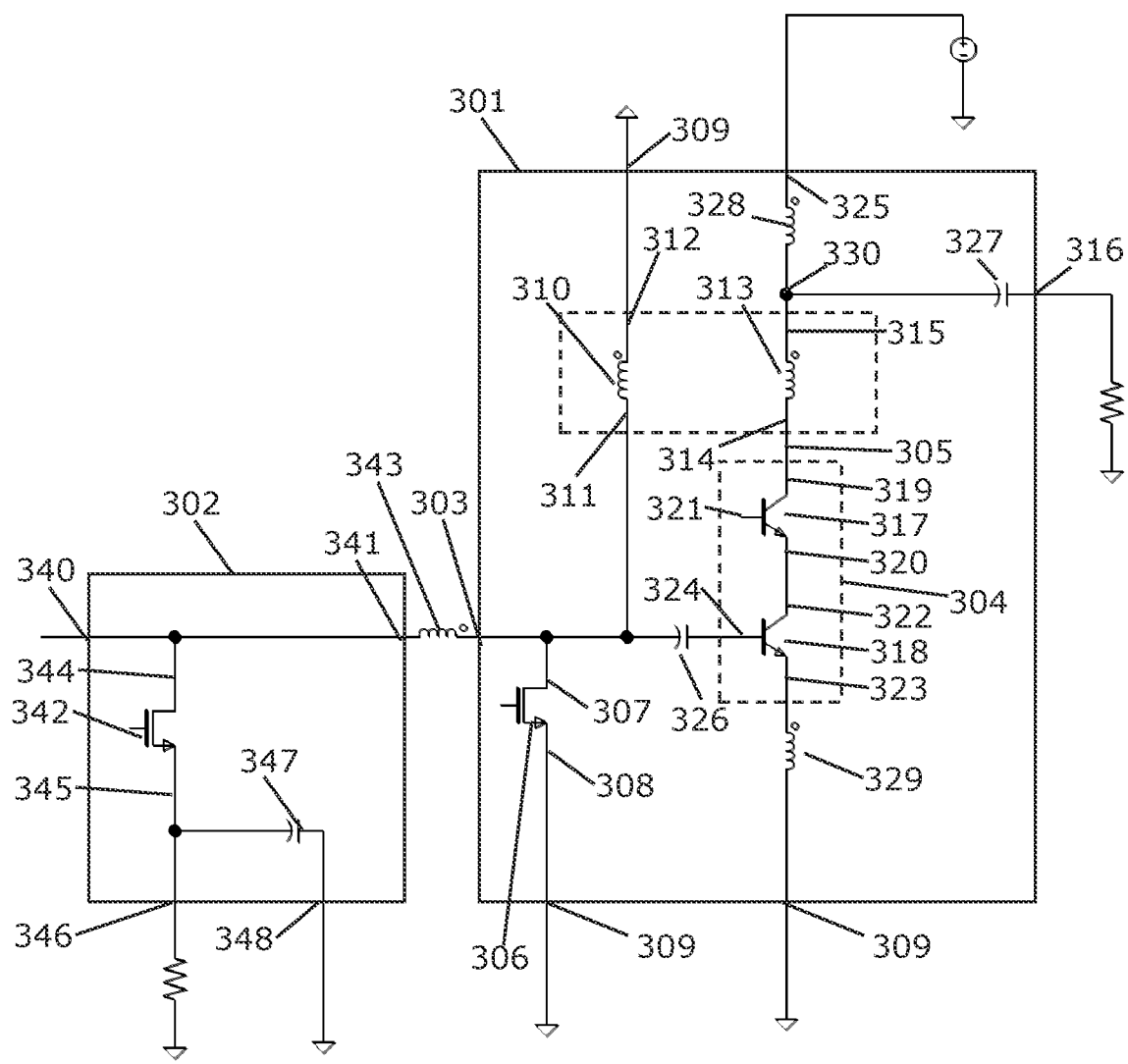
FIG. 3 shows a first example embodiment of a circuit, which may be formed on an amplifier die, and which may be provided in combination with a switch die.
Figure 4:
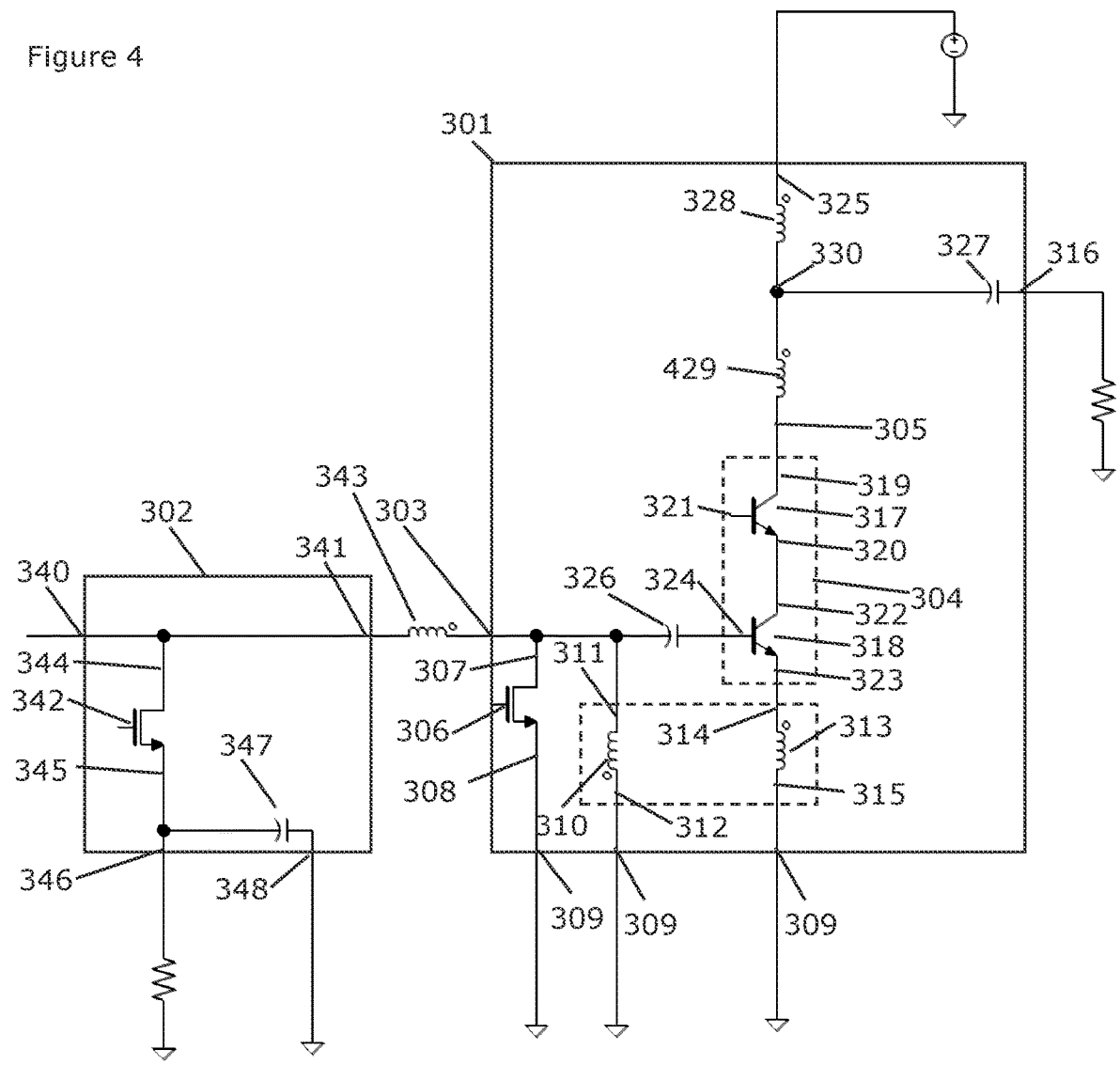
FIG. 4 shows a second example embodiment of a circuit formed on an amplifier die.
Figure 5:
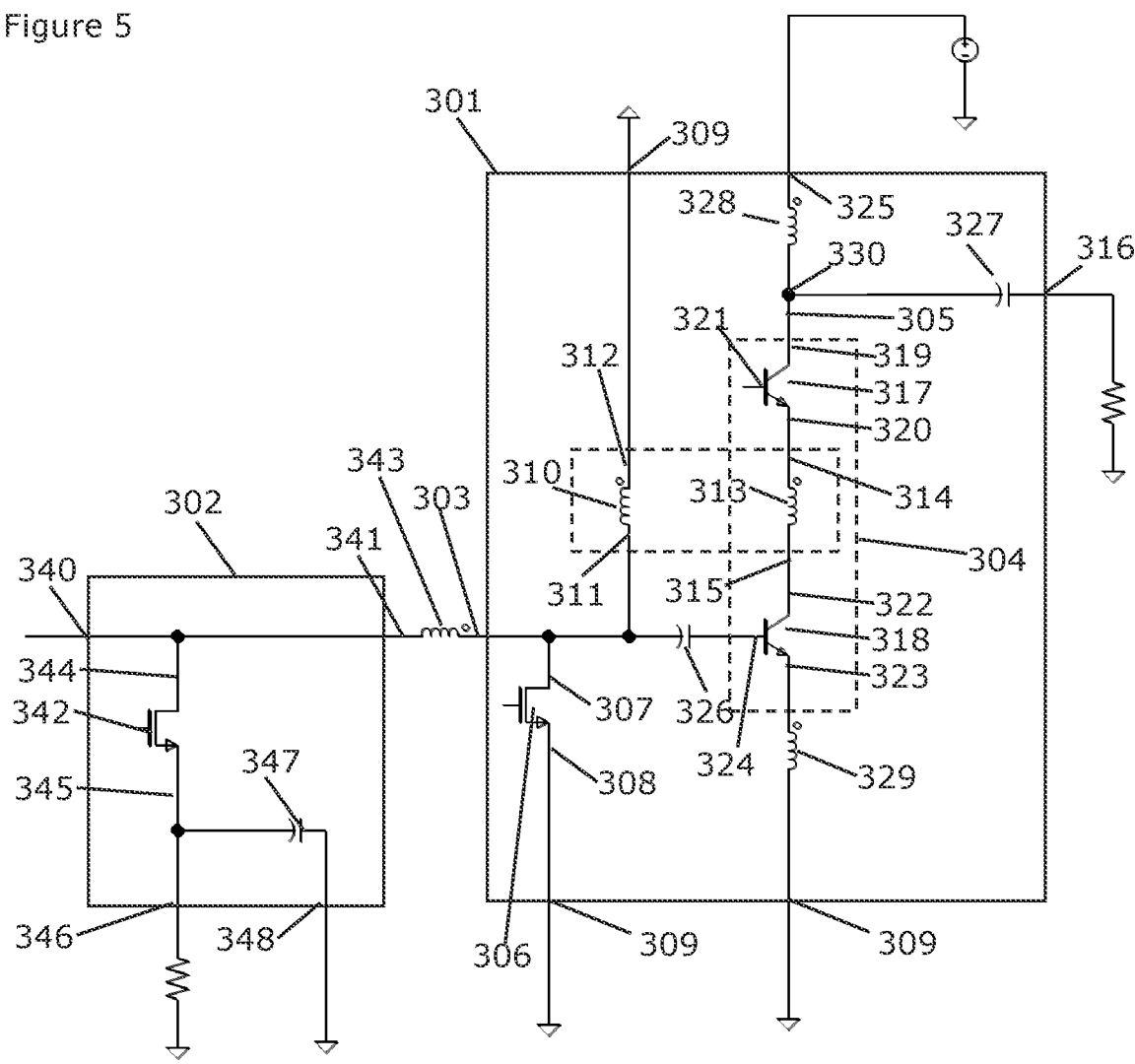
FIG. 5 shows a third example embodiment of a circuit formed on an amplifier die.

There now follows a description of three example embodiments of the disclosure with reference to FIGS. 3, 4 and 5. The embodiments may provide for one or more of reduced noise, improved gain and reduced return loss.

FIG. 3 shows a first example embodiment comprising a circuit, which may be provided on an amplifier die 301. It will be appreciated that the amplifier die may comprise other circuit component(s) and therefore may not exclusively comprise the circuit described below. The amplifier die 301 is shown in combination with a switch die 302. In one or more examples, the amplifier die 301 comprises part of a receive path of a receiver and includes at least one amplifier for amplification of an input signal received from an antenna, such as described below. The switch die 302 includes a resonant switch 342 and may provide an input signal to the amplifier die 301 from the antenna (which couples to terminal 340).

The amplifier die 301 or circuit comprises an input terminal 303. The input terminal 303 is configured to be coupled to the switch die 302 and, in use, on to an antenna (not shown) via the terminal 340.

The amplifier die 301 comprises at least a first amplifier 304 coupled to the input terminal 303 of the circuit (and amplifier die in this example) to receive an input signal. Accordingly, the first amplifier 304 is configured to receive the input signal via the switch die 302 for amplification. The amplifier 304 may be configured to provide the amplified signal at an output terminal 305. The first amplifier 304 may comprise a low-noise amplifier (LNA).

The amplifier die or circuit 301 includes a source of parasitic capacitance at the input terminal. In the examples that follow the source of the parasitic, input capacitance comprises a first switch 306 having a first terminal 307 coupled to the input terminal 303 of the amplifier die or circuit 301 and a second terminal 308 coupled to a ground terminal 309. The ground terminal may comprise a terminal of the die 301 that is configured to be coupled to a reference voltage, such as ground. The first switch 306 may be provided by a transistor, such as a FET, wherein the first terminal 307 is the drain, the second terminal 308 is the source and the gate terminal provides for control of the first switch 306. However, other transistor types may be used. Thus, at least when in the off-state, the first switch 306 may comprise a source of parasitic capacitance at the input to the circuit, which may be undesirable. It will be appreciated that the first switch 306 may not be the only example of a source of parasitic capacitance at the input terminal 303 for the circuit 301. Thus, in other examples, not presented in detail, the first switch 306 may be present in combination with one or more other components that introduce a parasitic capacitance or the first switch may be absent and said one or more other components coupled to the input terminal 303 introduce the parasitic capacitance. In one or more examples, said capacitance at the input terminal may be provided by one or more of an antenna coupled to the input terminal; a filter coupled to the input terminal 303; an input matching network coupled to the input terminal 303; a metal interconnect that couples the circuit 301 to one or more other components; a transmission line coupled to the input terminal; a parasitic capacitance of an inductor; and a substrate capacitance of an AC-coupling capacitor or DC-blocking capacitor. The circuit 301 will now be described with reference to the first switch 306 comprising the source of the parasitic capacitance but it will be appreciated the parasitic capacitance at the input terminal 303 may come from other components.

The amplifier die 301 further comprises a first inductor 310 having a first terminal 311 coupled to the input terminal 303 of the amplifier die 301 and a second terminal 312 coupled to the ground terminal 309. The first inductor 310 is arranged with a second inductor 313 such that the first inductor 310 and the second inductor 313 are a magnetically coupled pair of inductors. The first inductor 310 and second inductor 313 are thereby, collectively, a transformer. The second inductor 313 is coupled to the first amplifier 304 and configured to sense a current through the first amplifier 304. The second inductor 313 comprises a first terminal 314 coupled to the output terminal 305 of the first amplifier 304 and a second terminal 315 coupled to a die output terminal 316.

The first inductor 310 and second inductor 313 thus provide current feedback. In use, the current sensed by the second inductor 313 is, in effect, fed back to the first inductor 310 such that the effective inductance of the first inductor 310 is reduced. The advantages, which may be present in one or more examples, of providing such a reduced inductance when the switch is open will be described below.

The first inductor 310 and the second inductor 313 have a magnetic coupling ratio of N:1 wherein N>1. In one or more examples, N may be between greater than 1 and less than 25 or between 1 and 10. In one or more examples, N may be substantially 5.

The first amplifier 304, in this example, comprises a cascode arrangement of a first transistor 317 and a second transistor 318. The transistors 317 and 318 may comprise bi-polar junction transistors. The first transistor 317 has a first terminal 319 (e.g. a collector terminal), a second terminal 320 (e.g. an emitter terminal) and a control terminal (e.g. a base terminal). Similarly, the second transistor 318 has a first terminal 322 (e.g. a collector terminal), a second terminal 323 (e.g. an emitter terminal) and a control terminal 324 (e.g. a base terminal).

The first terminal 319 comprises the output 305 of the amplifier 304. The first terminal 319 is also coupled to a supply voltage terminal 325 for receiving a supply voltage. The control terminal 324 of the second transistor 318 is coupled to the input terminal 303 of the amplifier die 301. The first terminal 322 of the second transistor 318 is coupled with the second terminal 320 of the first transistor 317 to form said cascode arrangement. The second terminal 323 of the second transistor 318 is coupled to the ground terminal 309. The amplifier may be biased by a signal applied at the control, i.e. base, terminal 321 of the first transistor 317.

Further, in one or more examples, the first amplifier 304 and, in this example, the control terminal 324 of the second transistor 318 is coupled to the input terminal 303 via a capacitor 326 in series. The first capacitor 326 may comprise a polarized capacitor having an anode coupled to the input terminal 303 and a cathode coupled to an input to the first amplifier 304, that is the control terminal 324 in this example.

In the embodiment of FIG. 3, the second inductor 313 is coupled in series with between the supply voltage terminal 325 and the first transistor 317 and wherein the second terminal 315 is coupled to the supply voltage terminal 325 and the first terminal 314 is coupled to the first terminal 319 of the first transistor 317.

Further, the second terminal 315 of the second inductor 313 is coupled to the die output terminal 316 via a second capacitor 327. The second capacitor 327 may comprise a polarized capacitor having an anode coupled to the first terminal of the second inductor 313 and a cathode coupled to the die output terminal 316.

In one or more examples, the amplifier die 301 may include a third inductor 328 arranged such that the second terminal 315 of the second inductor 313 is coupled to the supply voltage terminal 325 in series with the third inductor 328. Further, in one or more examples, the second terminal 315 of the second inductor 313 is coupled to the die output terminal 316, via the second capacitor 327 at a node 330 between the second inductor 313 and the third inductor 328. In one or more examples, the amplifier die 301 may include a fourth inductor 329. Thus, the second terminal 323 of the second transistor 318 may be coupled to the ground terminal 309 via the fourth inductor 329.

The first inductor 310 is configured to provide electrostatic discharge protection for said amplifier die 301. In particular, the first inductor 310 provides a low impedance path to the ground terminal 309 and therefore to ground for frequencies at which electrostatic discharge typically occurs, but not for the RF frequencies of the input signal received at input 340 and 303. The first inductor 310 thus provides a high current discharge path (and may be provided with a wide metal track on the die accordingly) for an electrostatic discharge event.

The circuit arrangement of the amplifier die 301 may be advantageous in one or more examples because the first inductor 310 is configured to tune away the parasitic capacitance of the first switch 306 (or other source of parasitic capacitance at the input 303) when said first switch is in the off-state (at an operating frequency of the circuit). This may mitigate against loading of the input terminal 303. However, it is preferred for the inductance of the first inductor 310 to be large to reduce its noise impact, which may not be compatible with said aim of tuning away the parasitic capacitance. However, the examples of the present disclosure may be advantageous in terms of the arrangement of the first inductor 310 and the second inductor 313 being magnetically coupled, which may lead to an effect in which both low noise and appropriate tuning may be achieved. The inductance of the first inductor 310 is effectively reduced by its magnetic coupling to the second inductor 313 and the second inductor being configured to sense the current induced by the action of the amplifier 304. In particular, an input voltage to the circuit will result in a current flow at the control terminal 324 of the first amplifier 304. The first amplifier 304 provides a current gain and the second inductor 313 will effectively sense this current. The magnetic coupling to the first inductor then provides an induced voltage in the first inductor 310. This will cause an increase in current in the first inductor, which has the effect of reducing the inductance of the first inductor to an "effective inductance".

Thus, the effective inductance $L_{eff}$, that is the inductance it has by virtue of its coupling with the second inductor as described, is designed to tune out the capacitive load $C_{off}$ (off state capacitance) from the first switch 306 in this example.

$$L_{eff} = \frac{1}{C_{off} \cdot (2\pi f_c)^2}$$

Thus, $f_c$ represents the resonant frequency of the LC arrangement provided by the first inductor 310 (with the effect of the second inductor on the first inductor) and the capacitance of first switch 306. Accordingly, $L_{eff}$ is smaller than the inductance $L_{esd}$ of the first inductor 310 taken alone, due to the magnetic coupling with the current-sensing second inductor 313. The required inductance of the first inductor $L_{esd}$ can be calculated with $$L_{eff} = \frac{1}{\text{Im}\left(j\frac{1 + M\omega_T/Z_{in}}{L_{esd}}\right)}$$

where $\omega_T$ represents the transit angular frequency of the common-emitter input transistor 318 of first amplifier 304 and $Z_{in}$ comprises the input impedance of the first amplifier 304 and Im( ) comprises a function that returns the imaginary part of a complex number. Further, M comprises the mutual inductance, which can be calculated by $$M = K \cdot \sqrt{L_{esd} \cdot L_{isense}}$$

where K represents the magnetic coupling factor and $L_{isense}$ represents the inductance of the second inductor 313. The fact that $L_{esd} > L_{eff}$ may be advantageous because a large $L_{esd}$ will produce less noise, while the magnetic coupling allows for a large $C_{off}$ to be tuned away.

It will be appreciated that in other examples, $C_{off}$ represents the capacitance at the input terminal 303, such as parasitic capacitance, from one or more components that it is desirable to tune out.

As mentioned previously, the amplifier die 301 may be provided in combination with a separate switch die 302 which together form a front end module of a transceiver.

The switch die 302, in one or more examples, has a first switch-die terminal 340 for coupling to an antenna (not shown), a second switch-die terminal 341 for coupling to the amplifier die and a switch-die-switch 342 in parallel with said first switch-die terminal 340 and said second switch-die terminal 341. The second switch-die terminal 341 is coupled to the input terminal 303 of the amplifier die 301 via an inductor 343. The inductor 343 may be provided by a bond wire between the dies 301, 302.

Thus, the first switch-die terminal 340 is coupled to the second switch-die terminal 341, and the switch-die-switch 342 is coupled to both the first and second switch-die terminals 340, 341 by a first switch terminal 344. A second switch terminal 345 is coupled to a transmitter terminal 346, which is configured to receive a transmit signal for passing to the antenna via the first switch-die terminal 340. It will be appreciated that the transmit signal may be received from a source external to the switch die 302. Thus, the switch-die-switch 342 couples and decouples a transmitter from the antenna by its switching action.

In addition, the second switch terminal 345 may be coupled to a switch die capacitor 347 by a first plate wherein the second plate of the switch die capacitor 437 is coupled to the ground terminal 348. The switch die capacitor 347 may comprise a polarized capacitor having an anode coupled to the terminals 345, 346 and a cathode coupled to a ground terminal 348.

The resonant switch-die-switch 342 may be configured such that when the device of which the switch die and amplifier die is part is transmitting, the switch 342 and the first switch 306 are activated (on), and wherein the switch die capacitor 347 is in resonance with the inductor 343 at a frequency of interest. The inductor 343 and the capacitor 347 are therefore configured to be resonant at a frequency used for transmission, thereby providing good transmitter matching at input terminal 340 for the one or more signals to be provided to the antenna (the antenna is coupled to the terminal 340). With reference to FIGS. 1 and 2, the circulator 102 will be terminated with resistor 109, 209, 347. Thus, the circuit, in one or more examples, is configured to isolate the one or more amplifiers 304 of the circuit 301 and provide an LC resonant tank circuit. When the switch 342 and the first switch 306 are deactivated (off), the received signals are effectively received by the amplifier 304 and the off capacitance of the first switch 306 is tuned out by the effective inductance $L_{eff}$ of the first inductor 310 (due to its coupling with the second inductor 313). The large first inductor 310 of inductance $L_{esd}$ is thus low noise while still tuning out the off capacitance of the switch 306 with its effective inductance $L_{eff}$ when in use.

A second example embodiment is shown in FIG. 4. The circuits of the switch die 302 and the amplifier die 301 are similar to that described for FIG. 3 and therefore the same reference numerals have been used for like parts. The description that follows will highlight the differences.

In the example of FIG. 4, the arrangement of the second inductor 313 differs from that shown in FIG. 3.

In this example, said second inductor 313 is coupled in series with between the amplifier 304 and the ground terminal 309. The second inductor 313 is still able to sense the current through the amplifier 304 in this location and the operation of the circuit is the same as example embodiment described with reference to FIG. 3.

In particular, the second inductor 313 is coupled in series between the second transistor 318 and the ground terminal 309. The first terminal 314 of the second inductor 313 is coupled to the second terminal 323 of the second transistor 318 and the second terminal 315 is coupled to the ground terminal 309.

In this example, the fourth inductor 329 is not present. However, a fifth inductor 429 is provided between the first terminal 319 of the first transistor 317 (i.e. output of the amplifier 304) and the node 330.

A third example embodiment is shown in FIG. 5. The circuits of the switch die 302 and the amplifier die 301 are similar to that described for FIG. 3 and therefore the same reference numerals have been used for like parts. The description that follows will highlight the differences.

In the example of FIG. 5, the arrangement of the second inductor 313 differs from that shown in FIG. 3 and FIG. 4.

In this example, said second inductor 313 is coupled in series between the first transistor 317 and the second transistor 318 and the first terminal 314 is coupled to the second terminal 320 of the first transistor 317 and the second terminal 315 is coupled to the first terminal 322 of the second transistor 318. The second inductor 313 is still able to sense the current through the amplifier 304 in this location and the operation of the circuit is the same as example embodiment described with reference to FIG. 4.

In this example, the fourth inductor 329 is present. However, the fifth inductor 429 is not provided and the first terminal 319 of the first transistor 317 (i.e. output of the amplifier 304) is coupled directly to the node 330.

Figure 6:
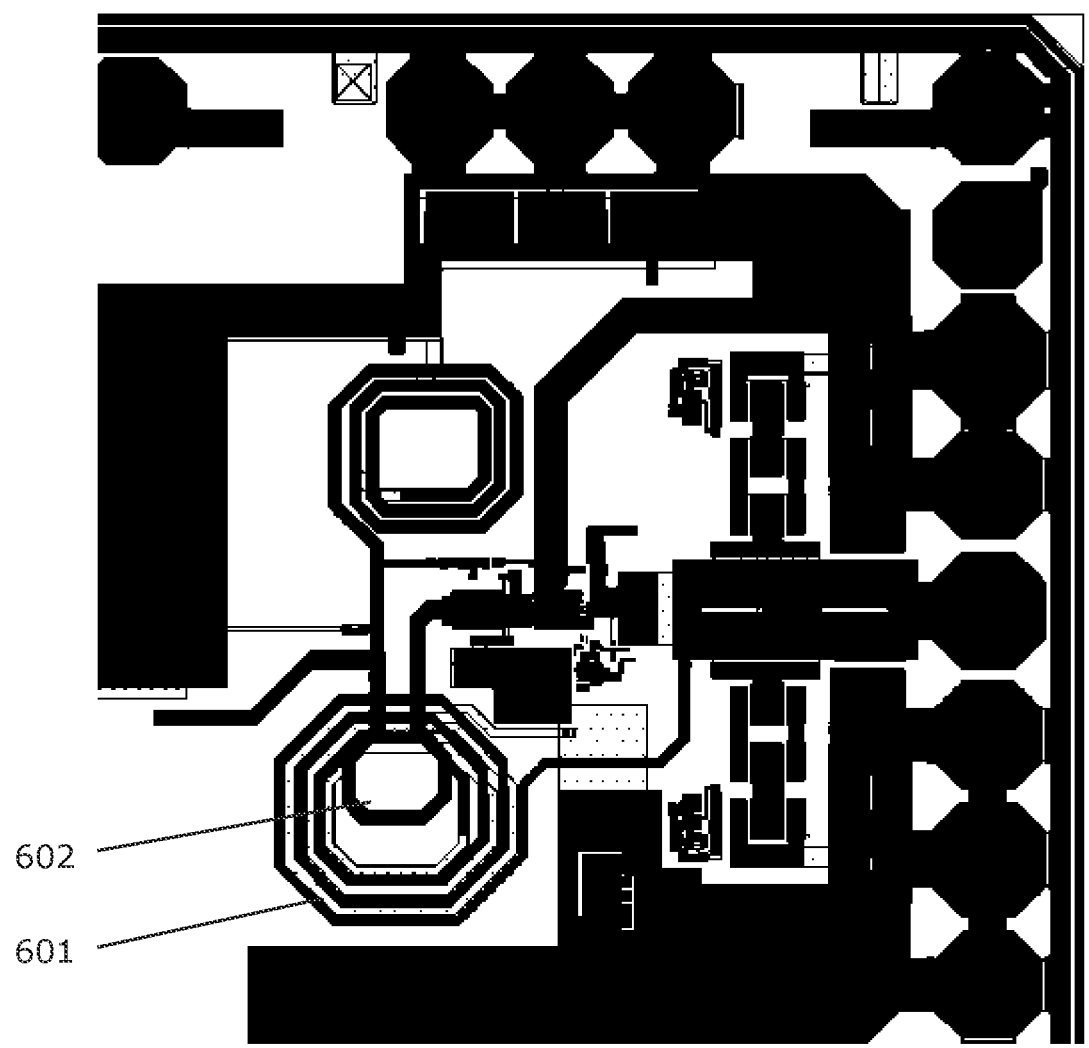
FIG. 6 shows an example physical layout of the amplifier die.

Example FIG. 6 shows an example physical layout of the amplifier die 301. The figure shows the first inductor 601 (numbered 310 in FIGS. 3, 4 and 5) and the second inductor 602 (numbered 313 in FIGS. 3, 4 and 5). The first inductor 601 and the second inductor 602 are aligned with one another in metal layers of the die, as can be seen in FIG. 6. Accordingly, the magnetic coupling between them is provided by the vertical alignment in the metal layers of the amplifier die.

In one or more examples, said amplifier die 301 is of Silicon-Germanium, SeGi. In one or more examples, said switch die 302 is of Silicon, such as of Silicon on Insulator CMOS type.

As described above, in one or more examples, the first inductor 310 is configured to resonate out the shunt capacitance which is introduced by the first switch 306 in the off state. The provision of the first inductor 310 as part of a transformer feedback circuit with the magnetically coupled second inductor 313 may be advantageous because the effect is that the inductance of the first inductor 310 can be large (thereby lowering its noise contribution) while still tuning out the large shunt capacitance of the first switch 306 in the off-state (due to its coupling with the second inductor causing a lower effective inductance $L_{eff}$). The first inductor 310 may also provide ESD protection without the need for ESD diodes thereby further lowering the noise.

We also disclose an electronic device including the amplifier die 301 and switch die 302 configured to be coupled to a receiver path and a transmitter path and an antenna. The electronic device may comprise a wireless base station, such as a 5G mini base station or 5G micro base station. In other examples, the electronic device may comprise a wireless LAN device.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A circuit comprising:
an input terminal;
a first amplifier coupled to the input terminal of the circuit to receive an input signal;
a first inductor having a first terminal coupled to the input terminal and a second terminal configured to be coupled to a ground terminal;
a second inductor, wherein the first inductor is arranged with the second inductor and configured to magnetically couple therewith, wherein said second inductor is coupled to the first amplifier and is configured to sense a current through the first amplifier; and
a first switch having a first terminal coupled to the input terminal and a second terminal coupled to a ground terminal, the ground terminal configured to be coupled to a reference voltage.

2. The circuit of claim 1, wherein said first inductor, in combination with said second inductor, is configured to tune out a capacitance at the input terminal at an operating frequency of the circuit.

3. The circuit of claim 1, wherein said first inductor, in combination with said second inductor, is configured to tune out a capacitance at the input terminal provided by one or more of:
an antenna;
a filter;
an input matching network;
an interconnect that couples the circuit to one or more other components;
a transmission line;
a parasitic capacitance of an inductor; and
a substrate capacitance of an AC-coupling capacitor or DC-blocking capacitor.

4. The circuit according to claim 1, wherein said first inductor is configured to provide electrostatic discharge protection for said circuit.

5. The circuit according to claim 1, wherein said first amplifier comprises a low noise amplifier.

6. The circuit according to claim 1, wherein the circuit is configured such that, when in use, the impedance of the first inductor is reduced by the coupling with the second inductor which leads to the first inductor having an effective inductance value lower than its actual inductance value and wherein the effective inductance value is configured to tune out a parasitic capacitance present at the input terminal.

7. The circuit according to claim 1, wherein the first inductor and second inductor are aligned with one another in separate layers of one of a die, a laminate or a printed circuit board.

8. The circuit according to claim 1, wherein said circuit is formed on a die of Silicon-Germanium.

9. The circuit of claim 2, wherein the circuit includes a first switch having a first terminal coupled to the input terminal and a second terminal coupled to a ground terminal, the ground terminal configured to be coupled to a reference voltage.

10. A circuit comprising:
an input terminal;
a first amplifier coupled to the input terminal of the circuit to receive an input signal;
a first inductor having a first terminal coupled to the input terminal and a second terminal configured to be coupled to a ground terminal;

a second inductor, wherein the first inductor is arranged with the second inductor and configured to magnetically couple therewith, wherein said second inductor is coupled to the first amplifier and is configured to sense a current through the first amplifier; and a first switch having a first terminal coupled to the input terminal and a second terminal coupled to a ground terminal, the ground terminal configured to be coupled to a reference voltage, wherein the first amplifier comprises a cascode arrangement of a first transistor and a second transistor, the first transistor having a first terminal, a second terminal and a control terminal, and the second transistor having a first terminal, a second terminal and a control terminal, the first terminal of the first transistor is coupled to a supply voltage terminal for receiving a supply voltage, the control terminal of the second transistor is coupled to the input terminal, the first terminal of the second transistor is coupled with the second terminal of the first transistor to form said cascode arrangement, and the second terminal of the second transistor is coupled to the ground terminal.

11. The circuit according to claim 10, wherein said second inductor is coupled in series with between the supply voltage terminal and the first transistor and comprises a first terminal coupled to the first terminal of the first transistor and a second terminal coupled to the supply voltage terminal.

12. The circuit according to claim 10, wherein said second inductor is coupled in series between the first transistor and the second transistor and comprises a first terminal coupled to the second terminal of the first transistor and a second terminal coupled to the first terminal of the second transistor.

13. The circuit according to claim 10, wherein said second inductor is coupled in series with between the second transistor and the ground terminal and comprises a first terminal coupled to the second terminal of the second transistor and a second terminal coupled to the ground terminal.

14. The circuit of claim 10, wherein said first inductor, in combination with said second inductor, is configured to tune out a capacitance at the input terminal at an operating frequency of the circuit.

15. The circuit of claim 10, wherein said first inductor, in combination with said second inductor, is configured to tune out a capacitance at the input terminal provided by one or more of:

an antenna;

a filter;

an input matching network;

an interconnect that couples the circuit to one or more other components;

a transmission line;

a parasitic capacitance of an inductor; and a substrate capacitance of an AC-coupling capacitor or DC-blocking capacitor.

16. The circuit according to claim 10, wherein the circuit is configured such that, when in use, the impedance of the first inductor is reduced by the coupling with the second inductor which leads to the first inductor having an effective inductance value lower than its actual inductance value and wherein the effective inductance value is configured to tune out a parasitic capacitance present at the input terminal.

17. A circuit comprising:

an input terminal;

a first amplifier coupled to the input terminal of the circuit to receive an input signal;

a first inductor having a first terminal coupled to the input terminal and a second terminal configured to be coupled to a ground terminal; and a second inductor, wherein the first inductor is arranged with the second inductor and configured to magnetically couple therewith, wherein said second inductor is coupled to the first amplifier and is configured to sense a current through the first amplifier, wherein said circuit is formed on an amplifier die and is provided in combination with a switch die, separate from the amplifier die, wherein the combination of the switch die and the amplifier die comprises an arrangement for forming a transceiver front end module, said switch die having a first switch-die terminal for coupling to an antenna, a second switch-die terminal coupled to the input terminal of the amplifier-die, and a switch-die-switch having a first terminal, which is coupled to one of the first switch-die terminal and the second switch-die terminal, and a second terminal for coupling to a transmitter terminal, the transmitter terminal for receiving a transmit signal for passing to an antenna at the first switch-die terminal.

18. The circuit according to claim 17, wherein said switch-die is of Silicon on Insulator CMOS type.

* * * * *